(12) United States Patent
Blednov

(10) Patent No.: US 8,487,703 B2
(45) Date of Patent: Jul. 16, 2013

(54) RADIOFREQUENCY AMPLIFIER

(75) Inventor: Igor Blednov, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/302,925

(22) Filed: Nov. 22, 2011

(65) Prior Publication Data

US 2012/0133442 A1    May 31, 2012

(30) Foreign Application Priority Data

Nov. 29, 2010    (EP) ..................................... 10252022

(51) Int. Cl.
*H03F 3/68*    (2006.01)

(52) U.S. Cl.
USPC .......................... 330/295; 330/124 R; 330/286

(58) Field of Classification Search
USPC ..................... 330/124 R, 295, 286, 84, 53–54
See application file for complete search history.

(56) References Cited

U.S. PATENT DOCUMENTS

| | | | |
|---|---|---|---|
| 6,646,321 B2 | 11/2003 | Roodnat | |
| 7,078,976 B2 | 7/2006 | Blednov | |
| 7,119,623 B2 | 10/2006 | Blednov et al. | |
| 7,138,872 B2 | 11/2006 | Blednov | |
| 7,262,656 B2 * | 8/2007 | Shiikuma .................. | 330/124 R |
| 7,372,334 B2 | 5/2008 | Blair et al. | |
| 7,443,264 B2 | 10/2008 | Blednov | |
| 8,013,680 B2 * | 9/2011 | Grondahl et al. ............. | 330/295 |
| 8,305,141 B2 * | 11/2012 | Jeong et al. ................ | 330/124 R |

| | | |
|---|---|---|
| 2005/0083723 A1 | 4/2005 | Blednov et al. |
| 2007/0024358 A1 | 2/2007 | Perugupalli et al. |
| 2010/0045385 A1 | 2/2010 | Pengelly |

FOREIGN PATENT DOCUMENTS

| | | |
|---|---|---|
| WO | 2004/025828 A2 | 3/2004 |
| WO | 2005/008694 A1 | 1/2005 |
| WO | 2006/123289 A2 | 11/2006 |
| WO | 2008/062371 A2 | 5/2008 |
| WO | 2009/031097 A1 | 3/2009 |
| WO | 2010/003865 A1 | 1/2010 |

OTHER PUBLICATIONS

Extended Search Report for European Patent Appln. No. 102520228 (Apr. 20, 2011).

Khanifar, A. et al. "Bias Circuit Topologies for Minimization of RF Amplifier Memory Effects", 33rd European Microwave Conference, Munich, pp. 1349-1352 (2003).

Pitzalis, O. et al. "Broad-Band Microwave Class-C Transistor Amplifiers", IEEE Transactions on Microwave Theory and Techniques, vol. MTT-21, No. 11, pp. 660-668 (Nov. 1973).

(Continued)

*Primary Examiner* — Hieu Nguyen

(57) ABSTRACT

An integrated radiofrequency amplifier with an operational frequency includes first and second Doherty amplifiers each having a main device, and a peak device connected at respective inputs and outputs by respective phase shift elements configured to provide a 90 degree phase shift at the operational frequency. An input of the amplifier is connected to the input of the main device of the first Doherty amplifier, an output of the amplifier is connected to the outputs of the peak devices of the first and second Doherty amplifiers and the input of the peak device of the first Doherty amplifier is connected to the input of the main device of the second Doherty amplifier by a phase shift element providing a 90 degree phase shift at the operational frequency.

14 Claims, 13 Drawing Sheets

OTHER PUBLICATIONS

Qureshi, J. H. et al. "A Wide-Band 20W LMOS Doherty Power Amplifier", IEEE International Microwave Symposium, pp. 1504-1507 (2010).

Eccleston, K.W. "Analysis of a Multi-Transistor Interleaved Doherty Amplifier", Microwave Conference, APMC Asia Pacific, IEEE, Piscataway, NJ, USA, pp. 1581-1584 (Dec. 7, 2009).

Eccleston, K.W. "Four-Transistor Interleaved Doherty Amplifier", The Institution of Engineering and Technology Journal, vol. 45, No. 15, 2 pgs. (Jul. 16, 2009).

Nam J. et al. "The Doherty Power Amplifier With On-Chip Dynamic Bias Control Circuit for Handset Application", IEEE Transactions on Microwave Theory and Techniques, vol. 55, No. 4, pp. 633-642 (Apr. 2007).

* cited by examiner

RADIOFREQUENCY AMPLIFIER

CROSS-REFERENCE TO RELATED APPLICATIONS

This application claims the priority under 35 U.S.C. §119 of European patent application no. 10252022.8, filed on Nov. 29, 2010, the contents of which are incorporated by reference herein.

The invention relates to high power radiofrequency amplifiers and in particular, although not exclusively, to Doherty amplifier circuits.

Doherty type amplifiers are widely used for power amplifiers in wireless communications due to their higher efficiency when handling variable power levels, which are common in multi-carrier wireless communications systems. Doherty amplifiers comprise a main amplifier and a peak amplifier, the main amplifier handling power levels up to a certain transition point and the peak amplifier adding its power to load at power levels above the transition point until the Doherty amplifier saturation point. Together, the main and peak amplifiers, which typically operate in different classes, can deliver an improved back-off power level efficiency compared with a similarly rated single stage AB- or A-class amplifier.

WO 2008/062371 describes the principles of Doherty amplifiers in further detail, and discloses embodiments in which multiple amplifiers are configured in parallel in order to allow a wider radiofrequency band at high power and to reduce tuning problems.

High power radiofrequency amplifiers, such as Doherty amplifiers as well as single-ended class AB amplifiers, tend to exhibit electrical memory effects which are particularly problematic in high RF power amplifiers at frequencies of 1 GHz and above. These memory effects result from parasitic inductances existing between the power supply and the amplifier's power device and from the speed of variation and magnitude of current consumption by the amplifier, which follows the envelope of the input signal modulation. Such parasitic inductances may exist as part of a power supply network. At higher modulation frequencies larger distortions tend to appear due to such memory effects. Doherty amplifiers tend to exhibit higher memory effects due to operation of the peak amplifier in C-class mode.

A. Khanifar et al., in "Bias Circuit Topologies for Minimization of RF Amplifier Memory Effects", 33 European Microwave Conference, Munich 2003, pp 1349-1352, discloses a circuit technique for addressing memory effects in RF amplifiers, in which transmission zeros are placed in the bias network transfer function, transmission zeros at the output of the device being formed by utilizing the series resonance properties of decoupling capacitors.

The operational frequency band of single-end class AB amplifiers and Doherty amplifiers is limited by, among other things, the matching networks which may require impedance transformation ratios of between 50 and 100. O. Pitzalis & R. Gilson, in "Broad-Band Microwave Class-C Transistor Amplifiers", IEEE Transactions on Microwave Theory and Techniques, Vol. MTT-21, No. 11, November 1973, disclose techniques for large-signal transistor characterization and design of broad-band input- and output-matching structures. A high impedance transformation ratio typically required for high power (100 to 300 W) discrete power devices in conventional Doherty amplifiers operating in the GHz region tends to restrict the bandwidth of the amplifier. Also according to Bode-Fano theory:

$$\int_{\omega_2}^{\omega_1} \ln\left(\frac{1}{\Gamma}\right) d\omega - \frac{1}{RC} - \frac{1}{R_L C_{ds}} \quad (1)$$

where $\omega_1$, $\omega_2$ are the lower and upper frequency limits. F is the reflection coefficient and $R_L$, $C_{ds}$ values for an optimal load resistance and parasitic output capacitor (e.g. the drain to source capacitance) of the power device. If the impedance of $C_{ds}$ at the operational frequency is comparable to $R_L$ it can be used as part of lumped element Doherty combiner, as for example proposed in U.S. Pat. No. 7,078,976, resulting in the negative effect of $C_{ds}$ being minimized A given impedance transformation ratio of two impedances $Z_L$ and $Z_O$ enabled by a quarter wave length impedance transformer will limit the available bandwidth $\Delta f$ at a required frequency of operation $f_c$ and a reflection coefficient $\Gamma_m$, according to the following relationship:

$$\frac{\Delta f}{f_0} = 2 - \frac{4}{\pi}\cos^{-1}\left[\frac{\Gamma_m}{\sqrt{1-\Gamma_m^2}} \cdot \frac{2\sqrt{Z_0 Z_L}}{|Z_L - Z_0|}\right] \quad (2)$$

As an example, if the impedance transformation ratio at an output of a 150 W device is 50, transforming from 1Ω to 50Ω, the output of the device allows for less than 7% of bandwidth at an efficiency loss of 3%.

According to impedance transformation theory, the bandwidth could be improved by introducing an infinite number of transformation steps. However, using more than 3 transformation steps do not bring significant improvements to bandwidth, but make the phase frequency response of the matching network more frequency dependent, further limiting the frequency band within which the load line of the Main device can be effectively modulated by the Peak device.

Conventional Doherty amplifiers having distributed transmission lines for impedance matching require approximately twice as much area when designed for operating at a frequency of 1 GHz than for 2 GHz. This is due to the required physical size of the transmission line becoming larger at lower frequencies. This poses a problem for miniaturisation of radio frequency amplifiers, particularly for mobile telecommunications equipment, which may use the lower part of the RF band from 0.4 to 2.7 GHz. As discussed in U.S. Pat. No. 7,443,264, a quarter wavelength 50Ω microstrip line for 1 GHz on a relatively high permittivity circuit board may occupy an area of around 5 mm×37 mm, which can more than double in size if a lower impedance is required. U.S. Pat. No. 7,443,264 further discloses compact impedance transformation circuits comprising combinations of parallel wire bonds and MOS capacitors.

Conventional Doherty amplifiers made of discrete power devices having a power level above 50 W also tend to have a narrow relative RF bandwidth, typically around 7% for a conventional Doherty amplifier made of two devices each rated at 100 W. The bandwidth may however be even smaller, for example due to the higher required transformation ratio in impedance matching connecting outputs of the Main and Peak devices to a Doherty combiner. High power conventional Doherty amplifiers made of discrete power devices are not therefore able to deliver operational bandwidths of more than 10% for output power levels around 250 W or more. For higher power output levels, the bandwidth available becomes even more limited.

U.S. Pat. No. 7,119,623 discloses output circuits for high power semiconductor amplifier elements, in which inductances and capacitances are configured to compensate for the output capacitance of the semiconductor amplifier element in order to suppress undesired harmonics within the output signal of the amplifier. U.S. Pat. No. 7,078,976 discloses high power Doherty devices having an integrated output Doherty combiner comprising capacitances and inductances configured as artificial transmission lines, the combiner being connected directly to the outputs of the Main and Peak devices and, as a result, allowing a wide frequency band of operation of up to 40% with a compensation LC network. This compensation network at certain LC values can be used also for connecting power supply to devices drain allowing wideband video-decoupling with low electrical memory effects.

An integrated Doherty amplifier in LDMOS technology has been demonstrated at 2 GHz, disclosed for example in WO 2008/062371, showing up to a 20% relative bandwidth. The bandwidth is limited by the input power splitting network. while the output network allows for 30% of bandwidth, further details of which are disclosed for example in U.S. Pat. No. 7,078,976 and by J. Qureshi et al., in "A Wide-Band 20 W LMOS Doherty Power Amplifier", International Microwave Symposium, May 23-28 2010, Anaheim, Calif.

At 1 GHz, a similar approach would require values of inductances in the range of 7 to 16 nH. Such values are difficult to implement in integrated form, due to the large areas required. An input also tends to result in a limited bandwidth of around 15%, A high Q-factor of the input impedance of a FET—based RF power amplifier (for example based on LDMOS technology) tends to limit the amplifier's operational bandwidth, according to the Bode-Fano relationship given above. Where a series RC represents the input network equivalent of FET (e.g. LDMOS, MOS, GaAs FET or PHEMT) device:

$$\Gamma_{max\_serRC} = e^{\frac{-\pi^2 f_0^2 RC}{2\Delta f}} \quad (3)$$

A typical LDMOS device exhibits a Q-factor of around 6 at 2 GHz and 12 at 1 GHz. As a result, the bandwidth of the input network at 1 GHz is very narrow, as indicated in the table below, while a required bandwidth may be 200 MHz or more.

| Reflection, (dB) | <-10 | <-15 | <-20 | <-30 |
|---|---|---|---|---|
| Bandwidth, (MHz) At 1 GHz | 150 | 100 | 75 | 50 |
| Bandwidth, (MHz) At 2 GHz | 600 | 400 | 300 | 200 |

Operation of the input network of an integrated Doherty amplifier comprising a pair of such devices is also limited to around the same bandwidth, due to the impedance transformation properties of the input power distribution network. The bandwidth may be partially improved by introducing resistive losses at the input of the devices, although this leads to a loss of power gain. Adding a resistive termination to improve the bandwidth may result in a loss of about 5 dB in power for a typical application as outlined above.

The listing or discussion of a prior-published document in this specification should not necessarily be taken as an acknowledgement that the document is part of the state of the art or is common general knowledge.

It is an object of the invention to address one of more of the above mentioned problems.

In accordance with a first aspect of the invention there is provided an integrated radiofrequency amplifier having an operational frequency, the amplifier comprising first and second Doherty amplifiers each comprising a main device and a peak device connected at respective inputs and outputs by respective phase shift elements configured to provide a 90 degree phase shift at the operational frequency, wherein an input of the amplifier is connected to the input of the main device of the first Doherty amplifier, an output of the amplifier is connected to the outputs of the peak devices of the first and second Doherty amplifiers and the input of the peak device of the first Doherty amplifier is connected to the input of the main device of the second Doherty amplifier by a phase shift element configured to provide a 90 degree phase shift at the operational frequency.

The phase shift elements connected to the inputs and outputs of the main and peak devices of the first and second Doherty amplifiers are preferably configured to provide a negative phase shift. The phase shift element connecting the input of the peak device of the first Doherty amplifier with the input of the main device of the second Doherty amplifier is preferably configured to provide a positive phase shift.

This arrangement of the amplifier solves the above mentioned problem of loss of power gain through reusing the power that would otherwise be lost in a resistive termination by redirecting this power to another Doherty amplifier input. The overall gain of the amplifier can thereby be improved.

Each main and peak device of the amplifier may comprise a field effect transistor (FET), a bipolar junction transistor (BJT), a heterojunction bipolar transistor (HBT) or a high electron mobility/heterostructure field effect transistor (HEMT/HFET).

The amplifier can be extended to include one or more further Doherty amplifiers, where each further amplifier circuit has its peak device output connected to the amplifier output and has its main device input connected to the peak device input of a preceding Doherty amplifier via a phase shift element configured to provide the same 90 degree phase shift at the operational frequency, but opposite by sign to that used at input of Doherty between the Main and Peak devices. Adding such further Doherty amplifiers further reuses power that would otherwise be lost, although each additional amplifier will have a diminishing effect on this power loss. As a result, a preferred number of Doherty amplifiers is 2 or 3, and preferably 4 or fewer.

The phase shift elements connecting the main and peak device outputs of each Doherty amplifier may comprise a pair of inductances connected in series to the outputs of the main and peak devices and a capacitance connected between a middle node connecting the pair of inductances and a ground plane connection of the amplifier.

The phase shift elements connecting the main and peak device inputs of each Doherty amplifier may comprise a low-pass filter comprising an inductance. In combination with the gate resistance and capacitance of the main and peak devices, the inductance provides the required 90 degree phase shift at the operational frequency of the amplifier.

The phase shift element connecting the input of the peak device of the first Doherty amplifier with the input of the main device of the second Doherty amplifier may comprise a high-pass filter comprising a pair of inductances connected between a ground plane connection of the amplifier and opposing terminals of a capacitance.

It should be noted that the low-pass filter could be replaced by a high-pass filter and vice versa.

The combination of high-pass and low-pass filter elements, which together act as a chain to direct power among the Doherty amplifiers, allows for a wideband group delay and a reduced loss of input power compared to existing solutions.

A circuit comprising the integrated radiofrequency amplifier may comprise a power supply network, wherein output terminals of the main and peak devices of each Doherty amplifier are connected to the power supply network via a supply line circuit configured to provide a phase shift at an operating frequency of the Doherty amplifier, the supply line circuit preferably comprising a pair of coupled conductors. The conductors may be in the form of magnetically and electrically mutually coupled inductors. Mutual coupling between the conductors is substantially stronger than for example coupling between each conductor and a ground plane. The supply line circuit may alternatively comprise a distributed transmission line having a characteristic impedance or a lumped element equivalent of a distributed transmission line. The supply line circuit preferably provides for a high "even" mode propagation characteristic impedance and a low "odd" mode propagation characteristic impedance.

An advantage of the use of a supply line circuit according to the invention is that of providing a reduced overall supply line inductance and, as a result, a reduced memory effect.

The supply line circuit may comprise a pair of mutually coupled inductances and a capacitance connected between a node connecting the pair of inductances and a ground connection, where the supply line circuit is in the form of a lumped element equivalent of a distributed transmission line. The pair of inductances may be provided as parallel bond wires, or alternatively as a pair of conductors formed on a substrate and separated by a dielectric layer. The pair of conductors and the dielectric layer may in some embodiments be formed as a ring shape on the substrate.

The supply line circuit may alternatively comprise a plurality of mutually coupled pairs of inductances and a capacitance connected between respective pairs of inductances. The pairs of inductances may be provided as a stack of conductors formed on a substrate and separated by dielectric layers.

The supply line circuit may comprise a lumped element equivalent of a quarter wavelength transmission line. Accordingly, the supply line circuit may comprise:
 a first parallel pair of magnetically coupled inductors;
 a second parallel pair of magnetically coupled inductors in series with the first parallel pair of inductors; and
 a capacitance between nodes of each parallel pair of inductors.

The supply line circuit may comprise a pair of wire bonds arranged in parallel and electrically connected in series via a bond pad providing a capacitive connection to ground. The supply line circuit may be connected directly to a drain connection of the main amplifier or the peak amplifier.

The invention is described in more detail below by way of illustrative exemplary embodiments, with reference to the accompanying drawings in which:

FIG. 5b is a schematic circuit diagram of the transmission line circuit of FIG. 5a;

FIG. 6b is a schematic circuit diagram of the supply transmission line of FIG. 6a;

Figure 1:
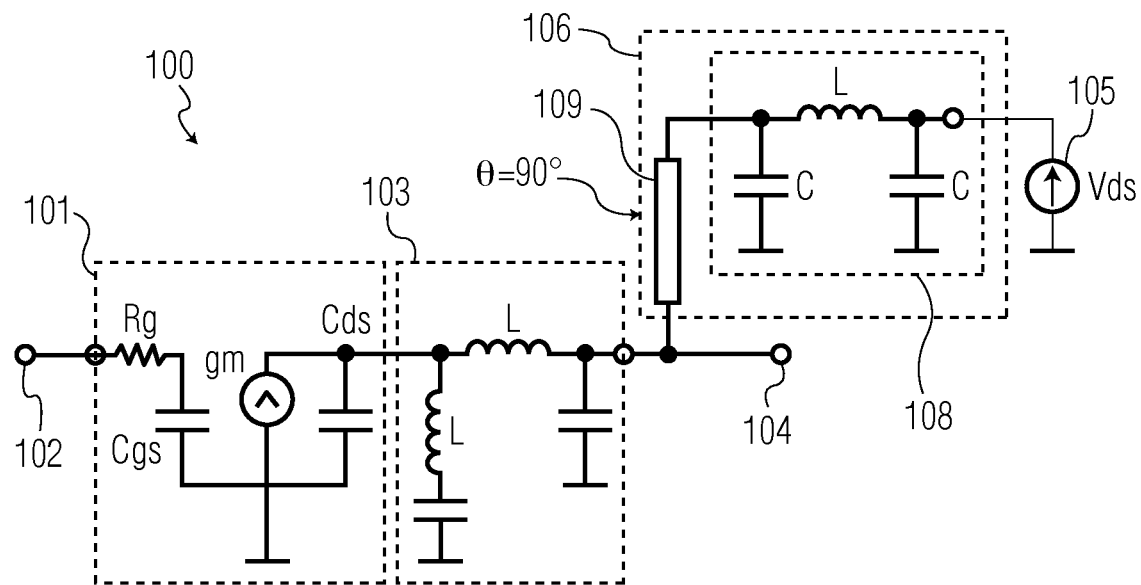
FIG. 1 is a schematic circuit diagram of a single end amplifier with a power supply connected via a transmission line.

Illustrated in FIG. 1 is a schematic circuit diagram of an exemplary single end amplifier 100. The amplifier 100 comprises an amplifier device die 101 having an input connection 102 and an output impedance matching circuit 103 connected between the device die 101 and an output connection 104. A power supply 105 is connected to the output impedance matching circuit 103 via a supply line 106 comprising a low pass LC circuit 108 and a quarter wavelength transmission line 109.

Figure 2:
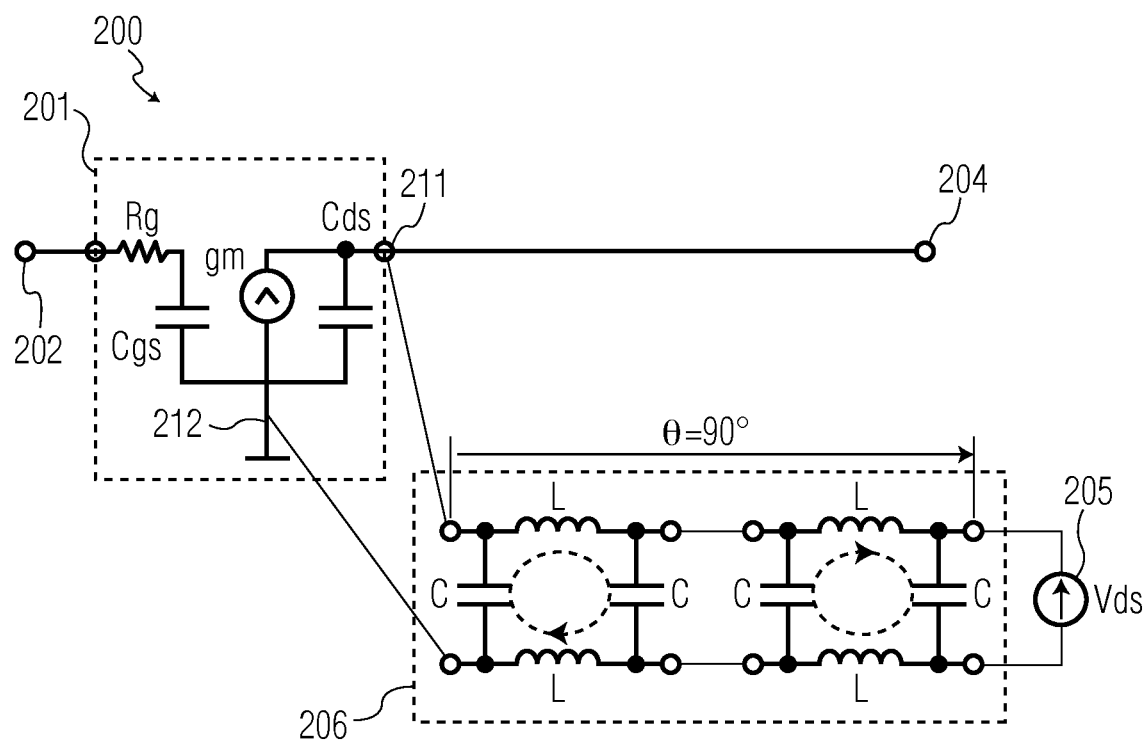
FIG. 2 is a schematic circuit diagram of a single end amplifier with a power supply connected via a low memory effect supply line.

Illustrated in FIG. 2 is a schematic circuit diagram of an amplifier 200 comprising a power supply source 205 connected to an active device die 201 via a power supply line circuit 206. The drain or collector terminal of the active device 201 is connected to the power supply source 205 through an integrated supply line 206. The supply line 206 is preferably provided on the same semiconductor die as an integrated Doherty device comprising a pair of such active devices, provided that the supply source 205 is connected to the reference, or ground, plane at the same point as the common terminal (the source or emitter) of the active device 201. The amplifier 200 comprises an amplifier device die 201 having an input connection 202 and an output connection 204. The supply line circuit 206 may be represented by one or more magnetically coupled parallel pairs of inductances L connected in series and with capacitances C between nodes of the inductances. The supply line circuit 206 is configured to provide a certain electrical length to provide a quarter wavelength phase shift between the amplifier device die 201 and the output terminal of the power supply source 205, at an operational frequency of the amplifier 200. The use of the supply line circuit 206 as compared with the supply line circuit 106 of FIG. 1 has the advantage of minimal inductive properties and a lower memory effect for the amplifier device die. The supply line circuit 206 is connected directly to a drain terminal 211 and a source terminal 212 of the amplifier device die 201.

Figure 3:
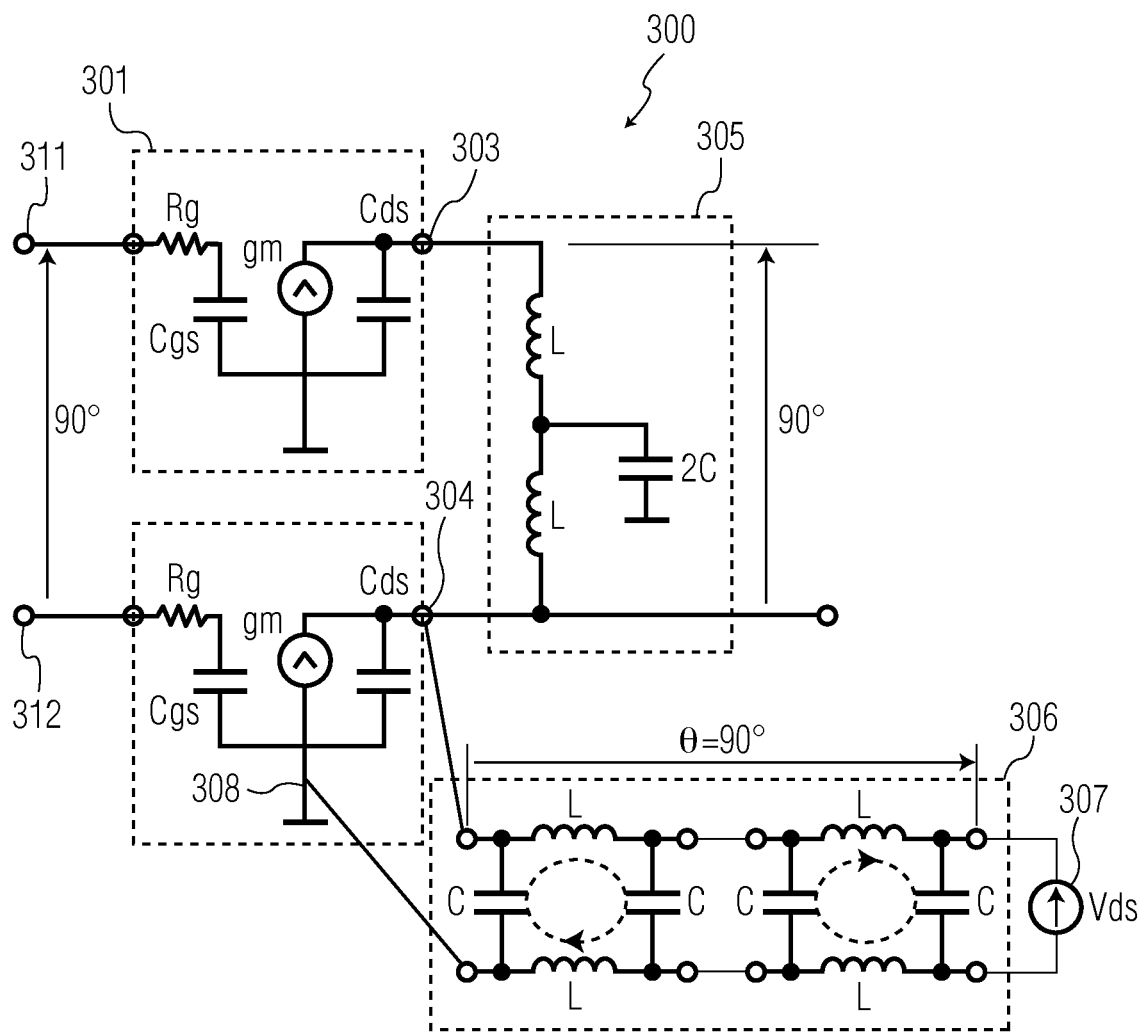
FIG. 3 is a schematic circuit diagram of a Doherty amplifier with a power supply connected to the peak amplifier via a low memory effect supply line.
Figure 4:
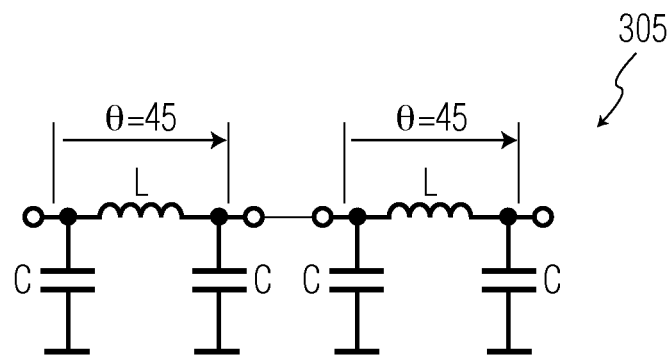
FIG. 4 is a lumped element circuit diagram representing an impedance matching network between the main and peak amplifier outputs of the Doherty amplifier of FIG. 3.

Illustrated in FIG. 3 is a schematic circuit diagram of an exemplary integrated Doherty amplifier device 300. The amplifier device 300 comprises a main amplifier 301 and a peak amplifier 302 provided on a single die as part of an integrated circuit package. The outputs 303, 304 of the main and peak devices 301, 302 are connected via a Doherty combiner network 305 comprising a pair of inductors either side of a capacitive connection to ground. An equivalent circuit of the combiner network 305 is illustrated in the schematic circuit diagram of FIG. 4, showing that each LC circuit making up the network 305 provides a 45 degree phase shift, and therefore together provides a 90 degree (quarter wavelength) shift between the main and peak amplifier outputs 303, 304.

A power supply 307 is connected to the output (or drain connection) 304 and the source connection 308 of the peak device 302 via a supply line circuit 306. The supply line circuit is similar to the supply line circuit 206 of FIG. 2.

As with conventional Doherty amplifiers, the Doherty amplifier 300 in FIG. 3 has a first input 311 connected to the main amplifier 301 and a second input 312 connected to the peak amplifier 302. Signals applied to the first and second inputs 311, 312 are phase shifted by 90 degrees relative to each other.

Figure 5A:
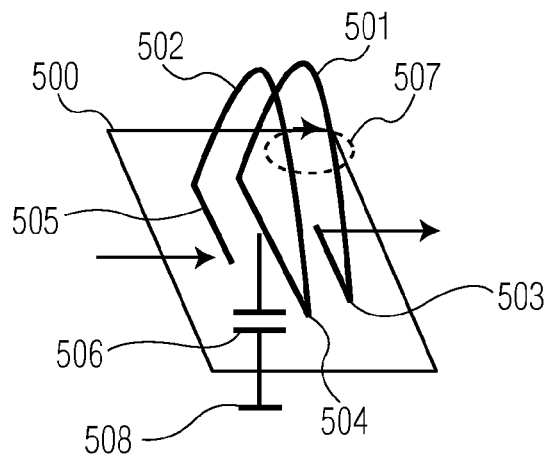
FIG. 5a is a schematic diagram of a lumped element equivalent of a wideband transmission line supply line circuit comprising a pair of coupled wire bond connections arranged in parallel and connected in series via a bond pad having a capacitive connection to ground.

Illustrated in FIG. 5a is a schematic diagram of an exemplary supply line circuit comprising a pair of wire bond connections 501, 502 on a substrate 500. A first wire bond connection 501 is made between a first bond pad 503 and a second bond pad 504. A second wire bond connection 502 is made between the second bond pad 504 and a third bond pad 505. A capacitive connection 506 is made between the second bond pad 504 and a ground connection 508. The first and second wire bond connections 501, 502 are electrically connected in series and are physically arranged in parallel by being connected at opposing ends of the second bond pad 504. This parallel configuration allows for magnetic coupling 507 between the wire bond connections 501, 502.

Figure 5B:
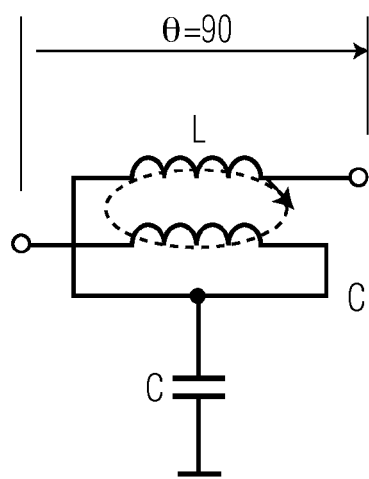

FIG. 5b illustrates in schematic circuit diagram form the supply line circuit of FIG. 5a, in which the wire bond connections 501, 502 are shown as a pair of coupled inductors and the capacitive connection 506 is shown as a capacitance to ground connected between the two inductances.

Figure 5C:
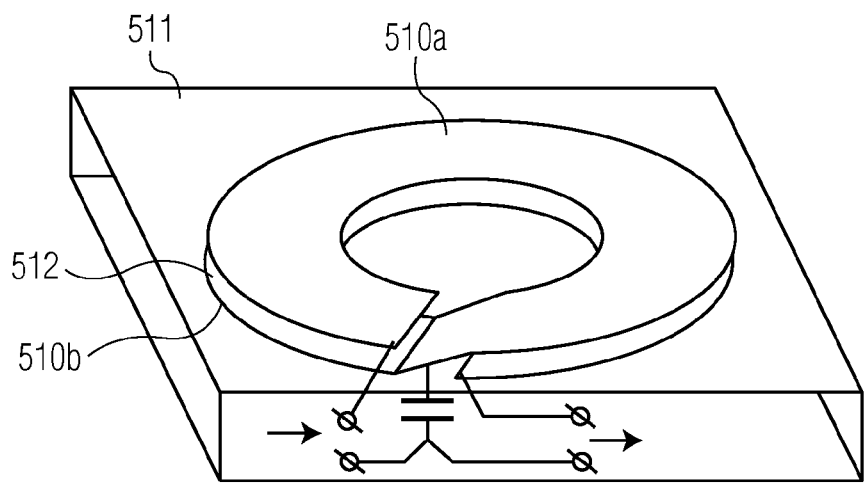
FIG. 5c is a schematic diagram of an alternative implementation of the transmission line of FIG. 5b, comprising broadside coupled conductors on a substrate, separated by a dielectric layer.

FIG. 5c illustrates an alternative embodiment of a supply line circuit comprising shielded broadside coupled conductor strips 510a, 510b in place of the coupled bond wires 501, 502 in FIG. 5a. The conductor strips 510a, 510b are provided on a substrate 511 and are separated by a dielectric layer 512. In the illustrated embodiment, the conductor strips 510a, 510b are provided in the form of a stack of rings on the substrate 511. As with the bond wire embodiment of FIG. 5a, the conductor strips 510a, 510b are connected in series, with a capacitive connection 512 to ground at a point where the strips 510a, 510b connect to each other. An advantage of this arrangement is that the conductor strips take up less vertical space on the substrate 511 than with the bond wire embodiment. Further conductor strips could be added to the embodiment of FIG. 5c with a minimal change in the overall space taken up by the supply line circuit by adding more conductor strips to the stack, each additional strip being separated from an underlying strip by a further dielectric layer.

Figure 6A:
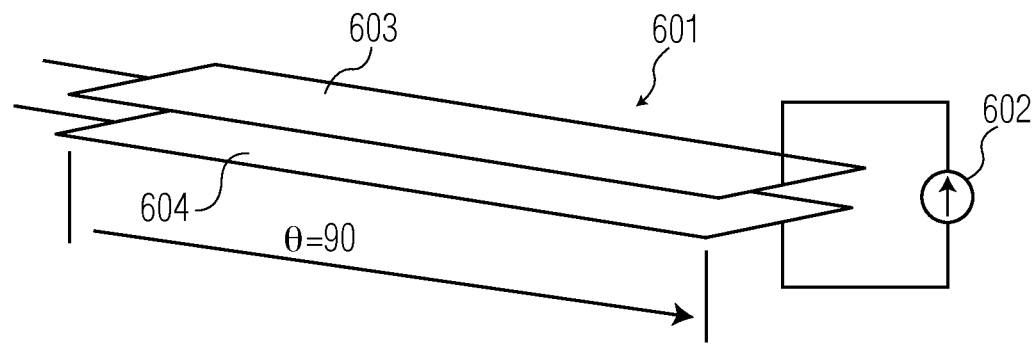
FIG. 6a is a schematic diagram of a supply transmission line configured to provide a quarter wavelength phase shift.
Figure 6B:
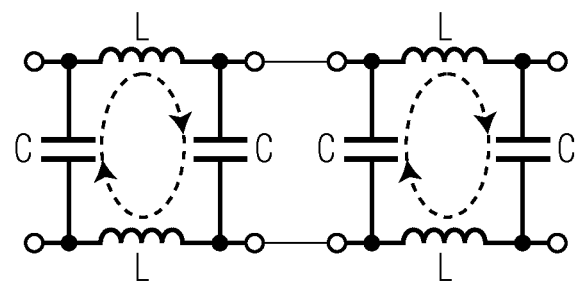

FIG. 6a illustrates in schematic form an exemplary transmission line 601 for use as a supply line circuit of the integrated Doherty amplifier of FIG. 3. The transmission line 601 is connected to a power supply 602 and provides output connections 605, 606 for being connected to the drain and supply connections of a main or peak amplifier device die of the Doherty amplifier. The transmission line 601 is in the form of a pair of parallel conductive plates 603, 604, which are represented in the schematic circuit diagram of FIG. 6b by pairs of parallel inductors connected in series, with capacitance connections therebetween. The parallel inductances are also shown in FIG. 6b as being magnetically coupled, as with the wire bond connections 501, 502 of the supply line circuit of FIGS. 5a and 5b and the conductor strip embodiment of FIG. 5c.

Figure 6C:
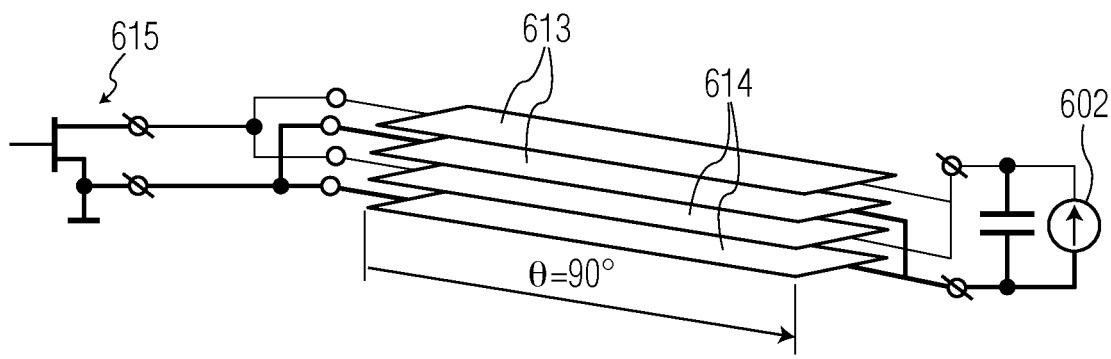
FIG. 6c is a schematic diagram of an alternative supply transmission line in the form of a stack of interleaved pairs of broadside coupled conductors separated by dielectric layers.

FIG. 6c illustrates a further exemplary embodiment of a supply transmission line, in which multiple pairs 613, 614 of conductors are arranged in a stack. This arrangement provides for a low equivalent inductance due to a stronger negative magnetic coupling between adjacent conductors of the stack. This reduces the inductive impedance of the transmission line and allows for a faster variation of current to flow through the line between the power supply 602 and the amplifier device 615.

Figure 7:
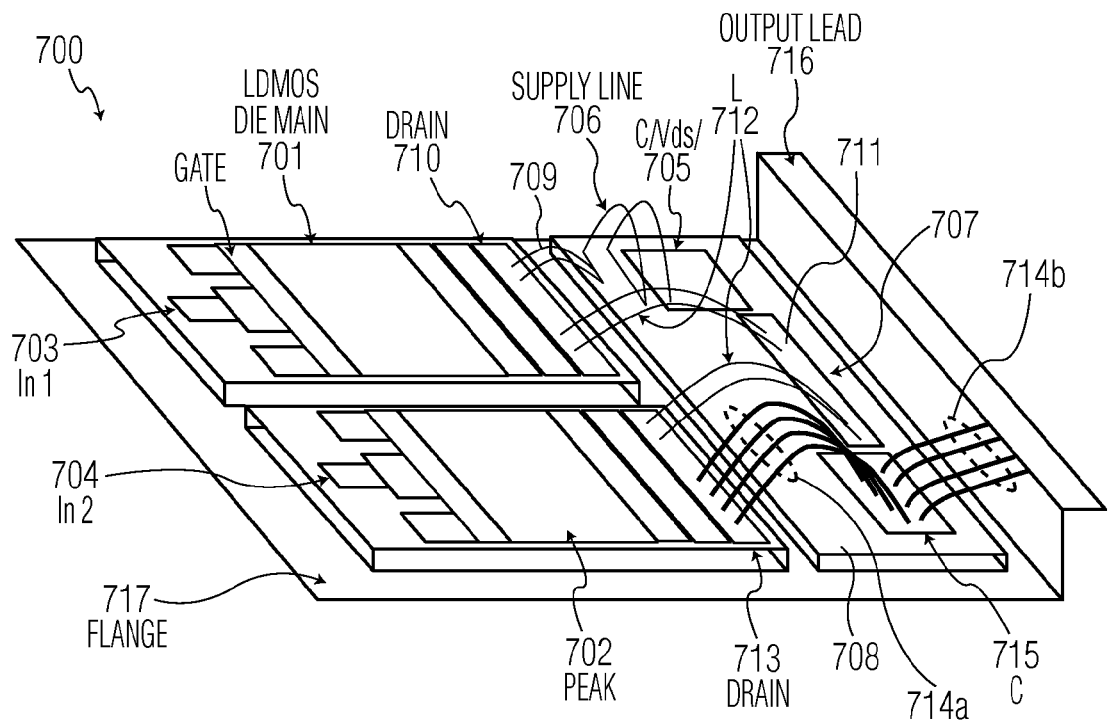
FIG. 7 is a schematic perspective diagram of an exemplary Doherty amplifier comprising a main device, a peak device and a power supply on different dies.

A schematic perspective view of the main components of an exemplary Doherty amplifier 700 is illustrated in FIG. 7. The Doherty amplifier 700 comprises a main amplifier device die 701 and a peak amplifier device die 702, implemented as LDMOS integrated circuits. A first input 703 is connected to the main amplifier 701 and a second input 704 is connected to the peak amplifier 702. A power supply 705, supply line 706 and output impedance matching circuit elements 707 are provided on a separate die 708. The supply line 705 is in the form described above in relation to FIGS. 5a and 5b.

Wire bond connections 709 connect the supply line 706 to the drain connection 710 of the main amplifier 701. Further wire bond connections 712 connect the drain connection 710 of the main amplifier 701 to the drain connection 713 of the peak amplifier 702 via a bond pad 711 on die 708 providing a capacitive connection to ground. Further multiple wire bond connections 714a, 714b connect the drain connection 713 to an output lead connection 716 via a further bond pad 715 providing a capacitive connection to ground.

All components of the Doherty amplifier 700 are arranged on a common substrate or flange 717, which may provide a common ground plane for connections to the various grounded capacitances and the source connections of the main and peak amplifiers 701, 702.

An integrated Doherty amplifier according to embodiments of the invention comprises multiple Doherty amplifier stages of the kind illustrated in FIG. 7. The input connections of such an integrated Doherty amplifier may be distributed between the various main and peak amplifiers as described in further detail below.

The main and peak devices of the Doherty amplifier circuits may comprise FET, BJT, HBT or HEMT devices.

The power supply source is preferably connected to a reference ground plane, for example provided by the common substrate 717, through a transmission line providing that forward and return supply currents are tightly coupled to each other by magnetic coupling.

Figure 8:
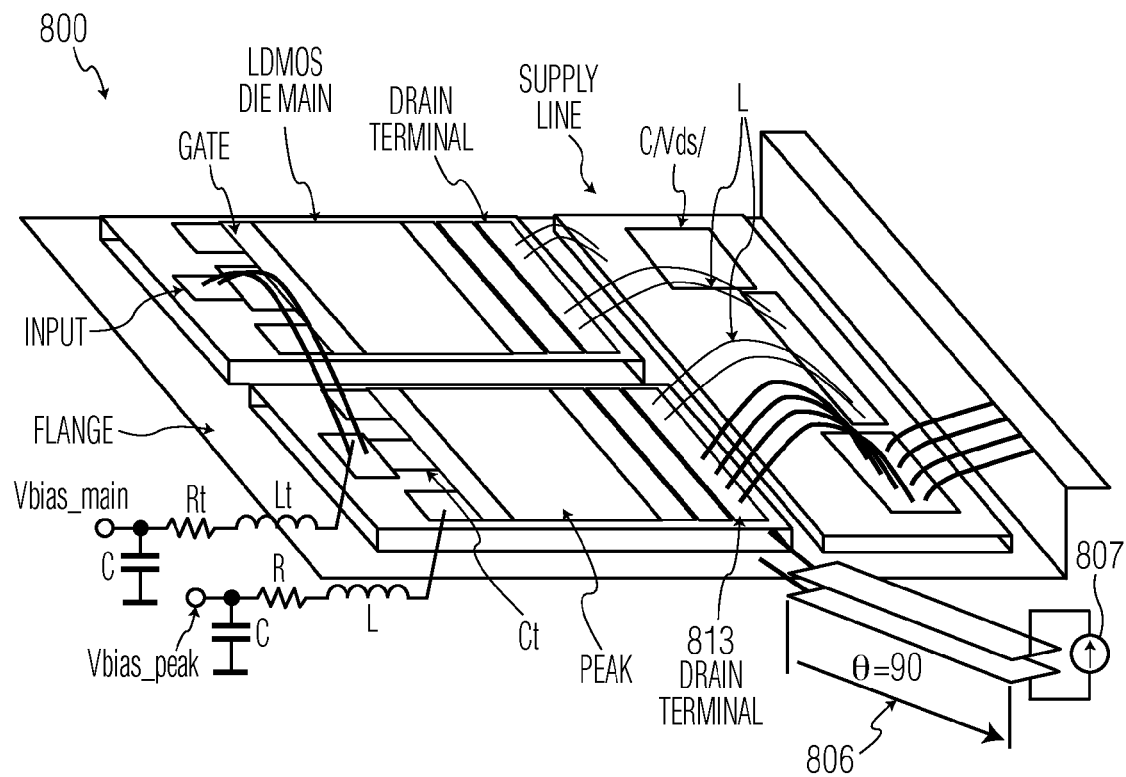
FIG. 8 is a schematic perspective diagram of a further exemplary Doherty amplifier arranged for wide band operation.

FIG. 8 illustrates an alternative embodiment of a single Doherty amplifier cell configured with wideband input and output networks, for example for use with wide band video applications. The amplifier 800 is of a similar construction to the embodiment shown in FIG. 7, but with a broad side coupled transmission line 806 connecting a power supply 807 to a drain terminal 713 of the peak device 802, instead of the wire bond connections of the embodiment of FIG. 7. Input bias voltage connections to the main and peak devices are also shown.

Where multiple main and peak device of the types described above are arranged in parallel in a single package, outputs of the peak devices are preferably connected to an output terminal of the package either directly or through a lumped element equivalent of appropriate characteristic impedance, series and shunt components of which may be made up of capacitances and inductances made of bond wire connections.

In embodiments comprising multiple parallel main and peak devices, all the main device and peak device inputs are preferably combined together by two separate cluster combine structures with each pair of main and peak devices connected at two separate input terminals, thereby allowing all of the devices to be provided with a uniform driving signal. The cluster power combiners may be arranged on the same die as the main and peak devices of an integrated Doherty amplifier or may be provided on separate substrates to allow for wideband input impedance transformation.

The power supply line preferably comprises one or more blocks having substantially identical characteristic impedance Zo and configured to provide a phase shift, the blocks being connected in series such that an overall phase shift is equal to 90 degrees at the centre of an operational frequency band of the amplifier. The phase shift provided by the supply line may alternatively be 90(2n+1) degrees, where n is a positive integer. The characteristic impedance of a single block making up the supply line is preferably equal to the optimal load impedance of the main device.

The ground terminal of the power supply source for the integrated Doherty amplifier is preferably connected to a common ground plane through the power supply transmission lines at the same point where the main and peak devices are connected to the common ground plane with their common terminal.

Figure 9A:
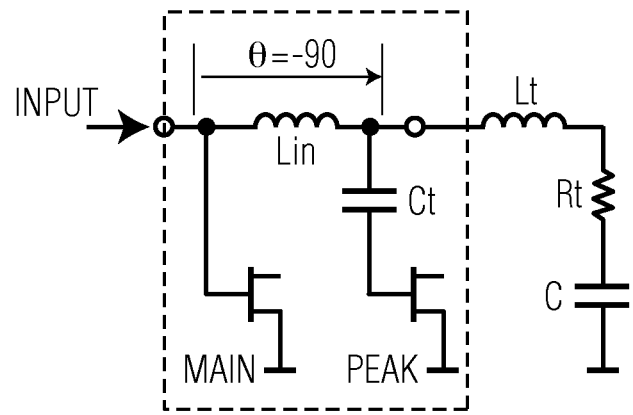
FIG. 9a is a schematic circuit diagram of a Doherty amplifier with an input phase shift element between main and peak devices of the amplifier.
Figure 9B:
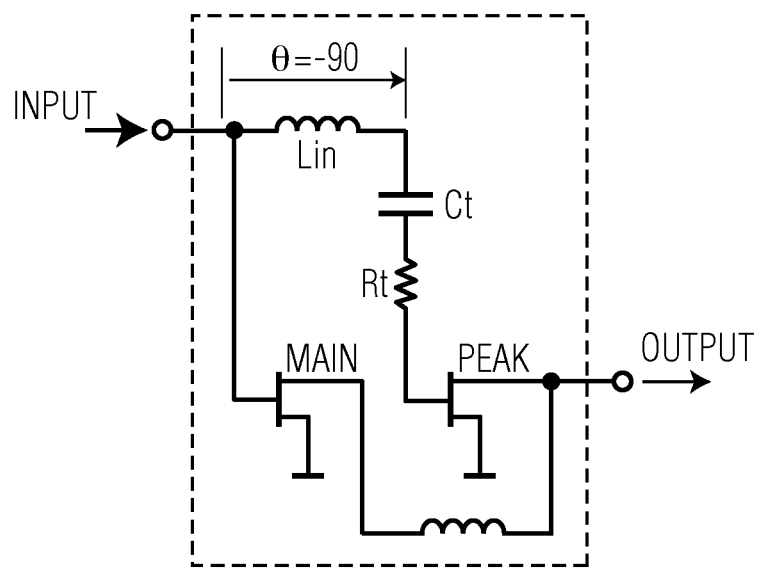
FIG. 9b is a schematic circuit diagram of a Doherty amplifier with an alternative input phase shift element between main and peak devices of the amplifier.

Two alternative input networks for FET/LDMOS Doherty amplifier circuits are illustrated schematically in FIGS. 9a and 9b. In each case, the input network provides a 90 degree phase shift between the inputs of the main and peak devices of the amplifier by means of a low-pass phase shift element connected between the main and peak devices. The values of the components Lt, Ct and Rt can be selected according to the required signal amplitude and phase for the operating frequency of the amplifier.

Figure 10A:
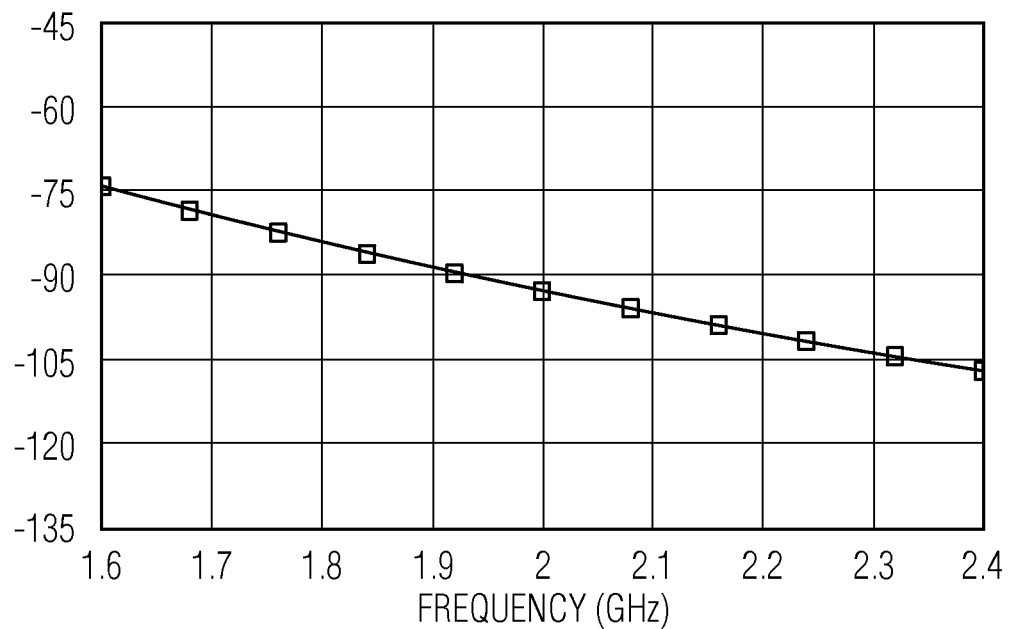
FIG. 10a is a simulated plot of phase shift between the main and peak devices of the Doherty amplifier of FIG. 9b as a function of frequency.
Figure 10B:
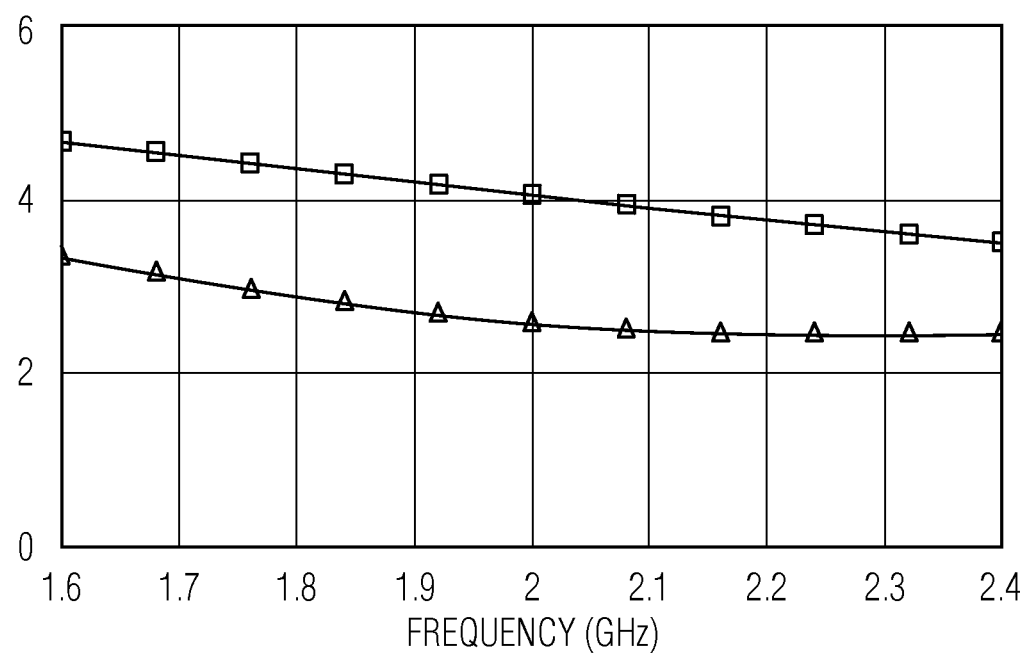
FIG. 10b is a simulated plot of peak gate voltage of the main and peak devices of the Doherty amplifier of FIG. 9b as a function of frequency.

Shown in FIGS. 10a and 10b are simulated plots of phase shift between the main and peak devices (FIG. 10a) and peak gate voltage for the main and peak devices (FIG. 10b) for the amplifier circuit of FIG. 9b. As can be seen in FIG. 10a, the low-pass phase shift element allows for a band width of over 40% (between 1.6 and 2.4 GHz) for a phase shift of 90 degrees+/−20 degrees. The peak gate RF voltages of the main and peak devices each vary by less than 1V over this frequency range.

Figure 11:
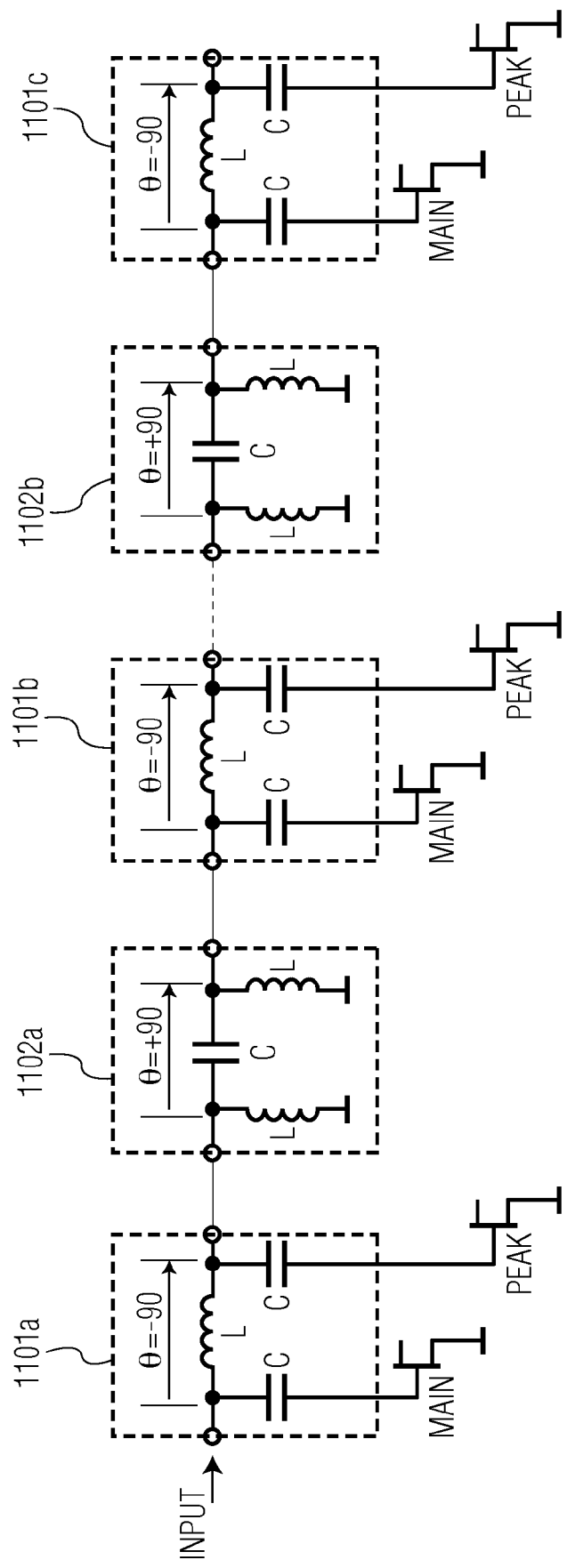
FIG. 11 is a schematic circuit diagram of a plurality of Doherty amplifiers serially connected by a lumped element transmission line comprising a chain of low-pass and high-pass phase shift elements.

Illustrated in FIG. 11 is a chain of Doherty amplifier circuits having low-pass phase shift elements 1101a-c connected between main and peak devices, with the inputs of the Doherty amplifier circuits being serially connected to each other by high-pass phase shift elements 1102a,b. The low-pass phase shift elements 1101a-c provide a −90 degree phase shift, while the high-pass phase shift elements 1102a,b provide a +90 degree phase shift. This combination allows for a wideband group delay with a minimal loss of input power.

Figure 12:
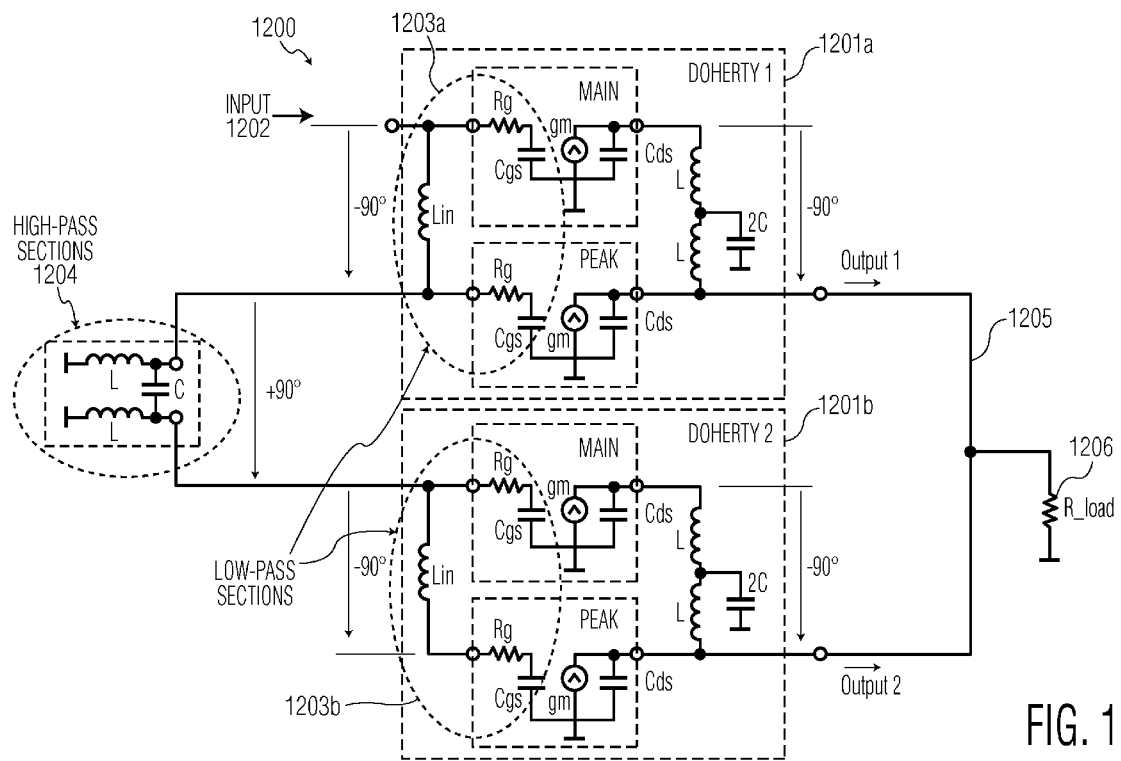
FIG. 12 is a schematic circuit diagram of an integrated Doherty amplifier circuit comprising first and second Doherty amplifiers having inputs connected by an input phase shift element.

FIG. 12 illustrates a schematic circuit diagram of an exemplary embodiment of an integrated Doherty amplifier 1200 comprising two Doherty amplifiers 1201a, 1201b having a common input 1202. The common input 1202 is connected to the input of the main device of the first Doherty amplifier 1201a, and is connected to the input of the main device of the second Doherty amplifier 1201b via a low-pass phase shift element 1203a of the first amplifier 1201a and a high-pass phase shift element 1204 connecting the inputs of the first and second Doherty amplifiers 1201a,b. Outputs of the Doherty amplifiers 1201a,b are connected to a common output 1205 and to a load impedance 1206.

Figure 13:
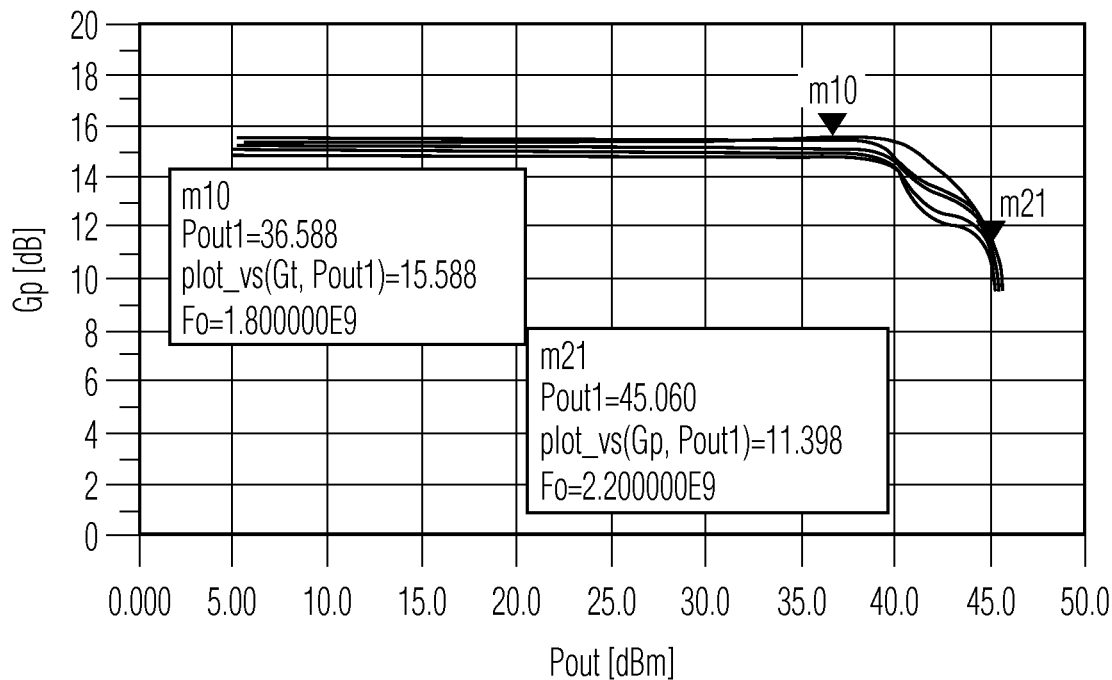
FIG. 13 is a simulated plot of power gain as a function of output power for an integrated Doherty amplifier according to an embodiment of the invention.
Figure 14:
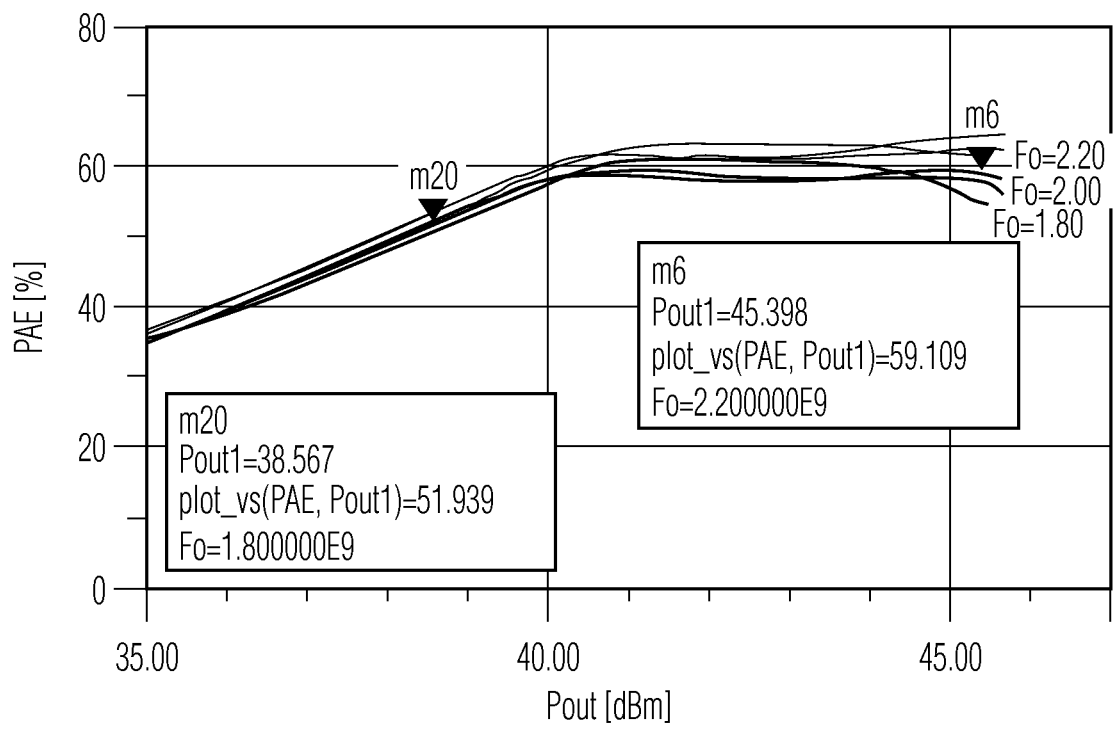
FIG. 14 is a simulated plot of power added efficiency as a function of output power for an integrated Doherty amplifier according to an embodiment of the invention.

FIGS. 13 and 14 illustrate plots of simulated power gain (FIG. 13) and power added efficiency (FIG. 14) as a function of output power for an exemplary integrated Doherty amplifier over a 20% bandwidth range. In the results shown, the bandwidth ranges between 1.8 and 2.2 GHz. The power gain remains substantially constant at around 15 dB up to an output power of 40 dBm, while the power added efficiency increases to around 60%

Figure 15:
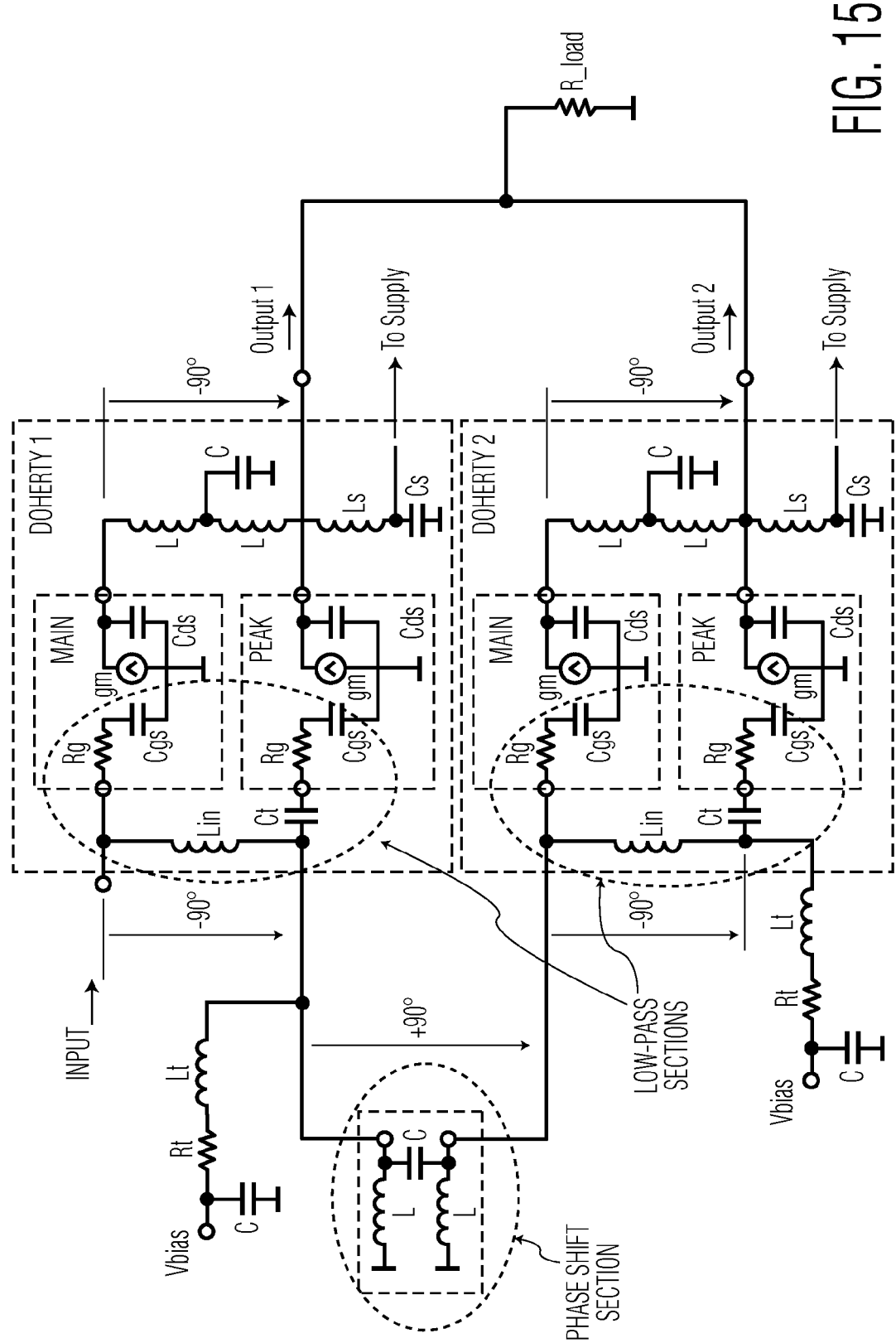
FIG. 15 is a schematic circuit diagram of an alternative integrated Doherty amplifier circuit comprising first and second Doherty amplifiers having inputs connected by an input phase shift element.

FIG. 15 is a schematic circuit diagram of an alternative integrated Doherty amplifier circuit to that shown in FIG. 12, the circuit also comprising first and second Doherty amplifiers having inputs connected by an input phase shift element. In this embodiment, voltage bias input circuits are indicated connected to the peak device inputs of the first and second Doherty amplifiers. Additional capacitors Ct are provided at the peak device inputs of each Doherty amplifier. Additional LC circuits comprising components Ls. Cs are connected between the outputs of the first and second Doherty amplifiers and ground, a mid-point node of each LC circuit connected to a power supply circuit. Gate bias and power supply voltages are connected to active devices of each Doherty amplifier through inductances Lt and Ls respectively.

Figure 16:
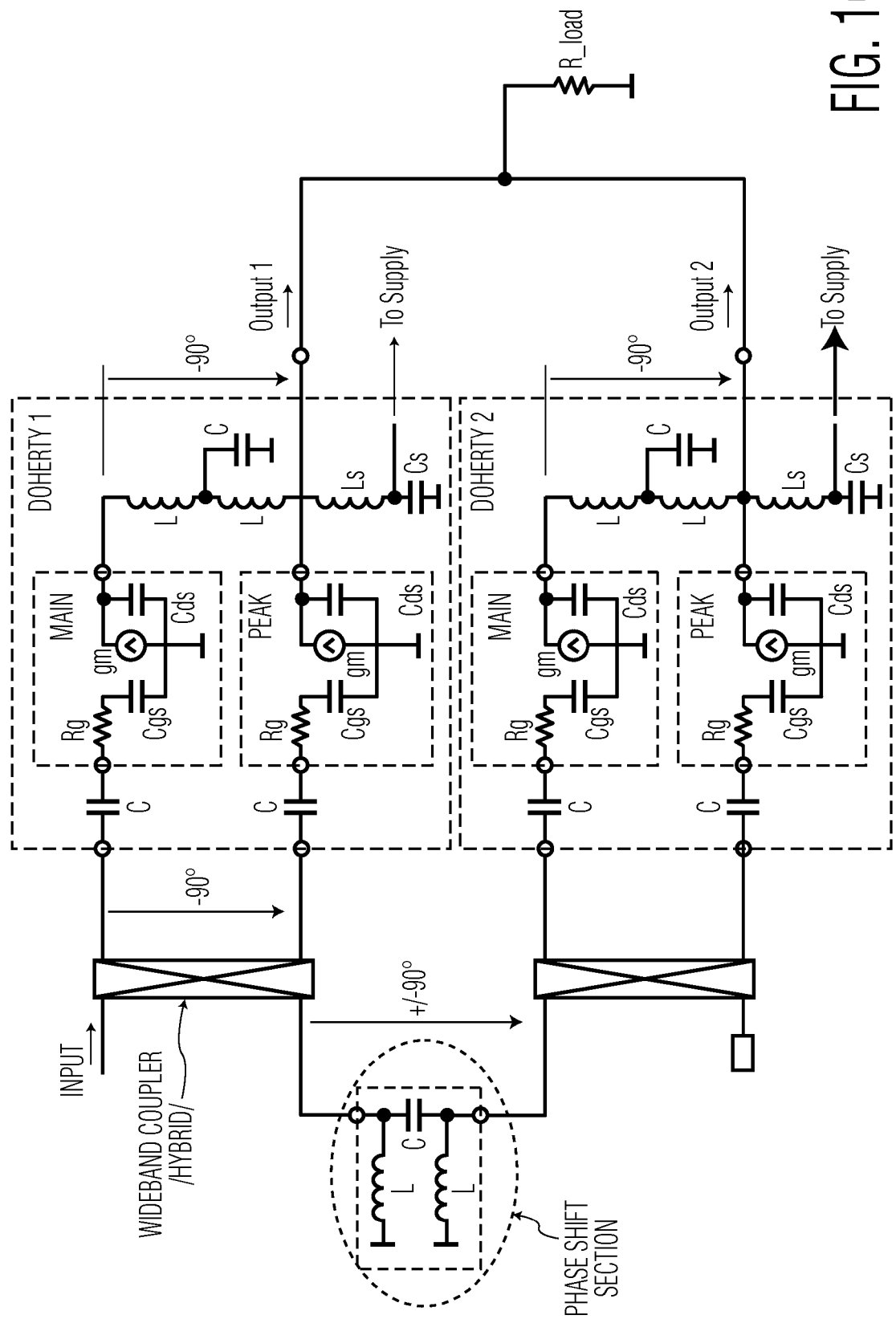
FIG. 16 is a schematic circuit diagram of a further alternative integrated Doherty amplifier circuit comprising first and second Doherty amplifiers having inputs connected by an input phase shift element.

FIG. 16 is a schematic circuit diagram of a further alternative integrated Doherty amplifier circuit comprising first and second Doherty amplifiers having inputs connected by an input phase shift element, where the phase shift elements at the inputs to each of the Doherty amplifiers are provided by wideband couplers in place of the inductances of the circuits of FIGS. 12 and 15.

Figure 17:
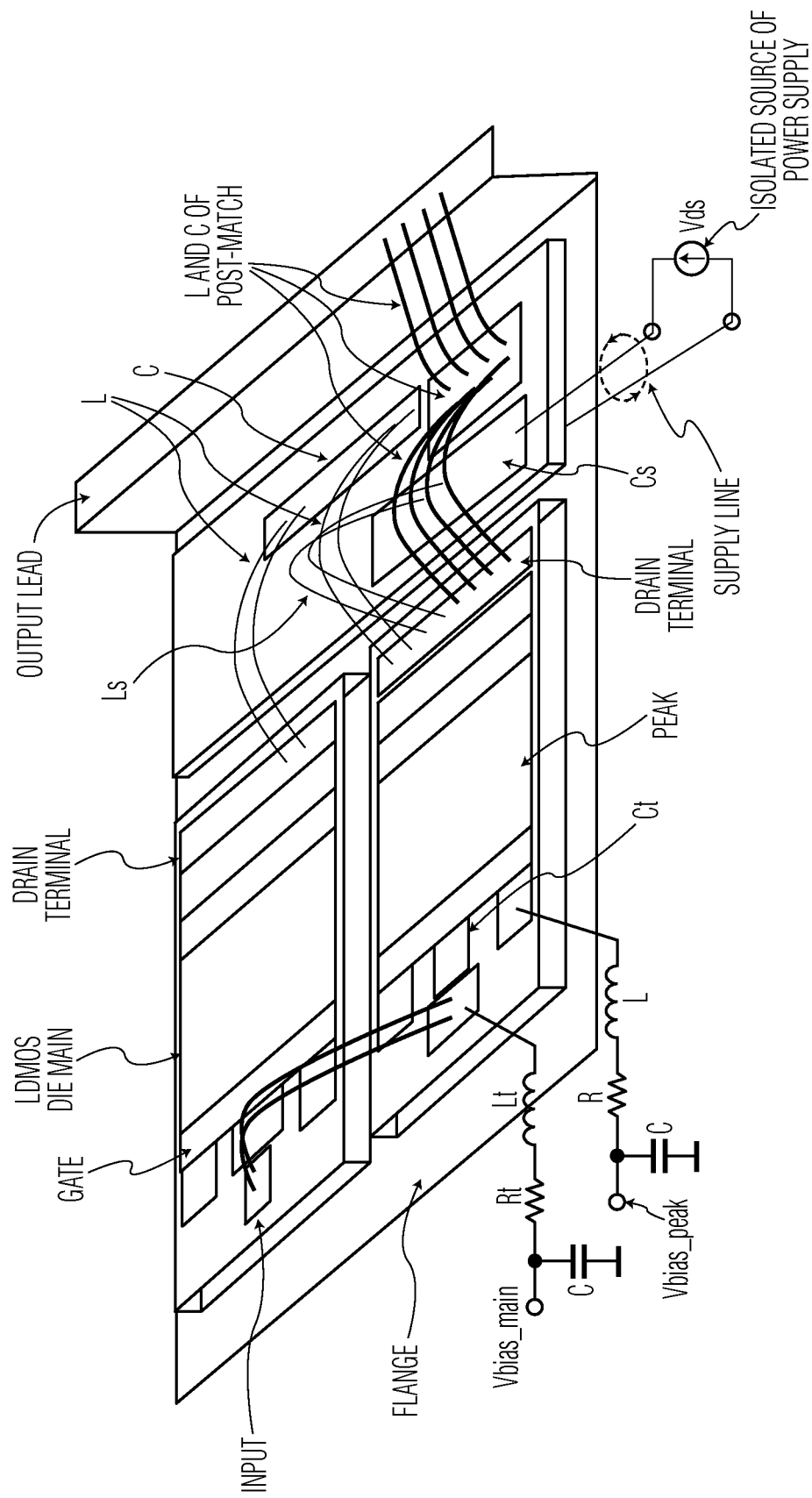
FIG. 17 is a schematic perspective diagram of a further alternative exemplary Doherty amplifier arranged for wide band operation.

FIG. 17 is a schematic perspective diagram of a further alternative exemplary Doherty amplifier arranged for wide band operation, in which further post-matching components are provided between the drain terminal of the peak device and the output lead of the amplifier.

Other embodiments are also within the scope of the invention, which is defined by the appended claims.

REFERENCES

[1] J. H. Qureshi et al., "A Wide-Band 20 W LMOS Doherty Power Amplifier", IEEE International Microwave Symposium 2010, pp 1504-1507.
[2] O. Pitzalis & R. A. Gilson, "Broad-Band Microwave Class-C Transistor Amplifiers", IEEE Transactions on Microwave Theory and Techniques, Vol. MTT-21, No. 11, 1973, pp 660-668.
[3] U.S. Pat. No. 7,119,623
[4] A. Khanifar et al., "Bias Circuit Topologies for Minimization of RF Amplifier Memory Effects", 33rd European Microwave Conference, Munich 2003, pp 1349-1352.
[5] WO 2004/025828
[6] U.S. Pat. No. 7,372,334
[7] US 2007/0024358
[8] U.S. Pat. No. 7,078,976
[9] US 2005/0083723
[10] U.S. Pat. No. 7,443,264
[11] U.S. Pat. No. 7,138,872
[12] WO 2008/062371
[13] WO 2009/031097
[14] WO 2010/003865

The invention claimed is:

1. An integrated radiofrequency amplifier having an operational frequency, the amplifier comprising first and second Doherty amplifiers each comprising a main device, and a peak device connected at respective inputs and outputs by respective phase shift elements configured to provide a 90 degree phase shift at the operational frequency,
wherein an input of the amplifier is connected to the input of the main device of the first Doherty amplifier, an output of the amplifier is connected to the outputs of the peak devices of the first and second Doherty amplifiers and the input of the peak device of the first Doherty amplifier is connected to the input of the main device of the second Doherty amplifier by a phase shift element configured to provide a 90 degree phase shift at the operational frequency;
wherein the phase shift element connecting the input of the peak device of the first Doherty amplifier with the input of the main device of the second Doherty amplifier comprises a high-pass filter comprising a pair of inductances connected between a ground connection of the amplifier and opposing terminals of a capacitance.

2. The integrated radiofrequency amplifier of claim 1 comprising one or more further Doherty amplifier circuits, each further amplifier circuit having a peak device output connected to the amplifier output and a main device input connected to the peak device input of a preceding Doherty amplifier via a phase shift element configured to provide a 90 degree phase shift at the operational frequency.

3. The integrated Doherty amplifier of claim 2 wherein the number of Doherty amplifiers is 4 or fewer.

4. The integrated Doherty amplifier of claim 1 wherein the phase shift elements connecting the main and peak device outputs of each Doherty amplifier comprise a pair of inductances connected between a node connecting the pair of inductances and a ground connection of the amplifier.

5. The integrated Doherty amplifier of claim 1 wherein the phase shift elements connecting the main and peak device inputs of each Doherty amplifier comprise a low-pass filter comprising an inductance in combination with a gate resistance and capacitance of the main and peak devices.

6. A radiofrequency amplifier circuit comprising the integrated radiofrequency amplifier of claim 1 and a power supply network, wherein output terminals of the main and peak devices of each Doherty amplifier are connected to the power supply network via a supply line circuit comprising a pair of mutually coupled conductors forming inductances and a capacitance connected between a node connecting the pair of conductors and a ground connection.

7. The integrated radiofrequency amplifier circuit of claim 6 wherein the supply line circuit comprises a lumped element equivalent of a quarter wavelength transmission line.

8. The integrated radiofrequency amplifier circuit of claim 7 wherein the supply line circuit comprises:
a first parallel pair of magnetically coupled conductors;
a second parallel pair of magnetically coupled conductors in series with the first parallel pair of conductors; and
a capacitance between nodes of each parallel pair of conductors.

9. The integrated radiofrequency amplifier circuit of claim 8 wherein the supply line circuit comprises a pair of magnetically coupled conductors arranged in parallel and electrically connected in series via a bond pad providing a capacitive connection to ground.

10. The integrated radiofrequency amplifier circuit of claim 1 wherein a supply line circuit is connected to a drain connection of the main amplifier or the peak amplifier.

11. An integrated radiofrequency amplifier having an operational frequency, the amplifier comprising first and second Doherty amplifiers each comprising a main device, and a peak device connected at respective inputs and outputs by respective phase shift elements configured to provide a 90 degree phase shift at the operational frequency,
wherein an input of the amplifier is connected to the input of the main device of the first Doherty amplifier, an output of the amplifier is connected to the outputs of the peak devices of the first and second Doherty amplifiers and the input of the peak device of the first Doherty amplifier is connected to the input of the main device of the second Doherty amplifier by a phase shift element configured to provide a 90 degree phase shift at the operational frequency; and
a power supply network, wherein output terminals of the main and peak devices of each Doherty amplifier are connected to the power supply network via a supply line circuit comprising a pair of mutually coupled conductors forming inductances and a capacitance connected between a node connecting the pair of conductors and a ground connection.

12. The integrated radiofrequency amplifier circuit of claim 11 wherein the supply line circuit comprises a lumped element equivalent of a quarter wavelength transmission line.

13. The integrated radiofrequency amplifier circuit of claim 12 wherein the supply line circuit comprises:
a first parallel pair of magnetically coupled conductors;
a second parallel pair of magnetically coupled conductors in series with the first parallel pair of conductors; and
a capacitance between nodes of each parallel pair of conductors.

14. The integrated radiofrequency amplifier circuit of claim 13 wherein the supply line circuit comprises a pair of magnetically coupled conductors arranged in parallel and electrically connected in series via a bond pad providing a capacitive connection to ground.

* * * * *